United States Patent [19]
Hong

[11] Patent Number: 6,051,479
[45] Date of Patent: Apr. 18, 2000

[54] METHOD OF FABRICATING SHALLOW TRENCH ISOLATION

[75] Inventor: Gary Hong, Hsin-Chu, Taiwan

[73] Assignee: United Semiconductor Corp., Hsinchu, Taiwan

[21] Appl. No.: 09/140,114

[22] Filed: Aug. 25, 1998

[30] Foreign Application Priority Data

Jun. 2, 1998 [TW] Taiwan ............................. 87108605

[51] Int. Cl.⁷ ............................................. H01L 21/76
[52] U.S. Cl. ..................... 438/425; 438/424; 438/426; 438/435
[58] Field of Search ................... 438/424, 425, 438/435, 437, 426, 444

[56] References Cited

U.S. PATENT DOCUMENTS

| | | | |
|---|---|---|---|
| 4,942,137 | 7/1990 | Sivan et al. | 438/426 |
| 5,679,599 | 10/1997 | Mehta | 438/425 |
| 5,786,256 | 7/1998 | Gardner et al. | 438/305 |
| 5,801,083 | 9/1998 | Yu et al. | 438/435 |
| 5,817,566 | 10/1998 | Jang et al. | 438/424 |
| 5,930,620 | 7/1999 | Eristers et al. | 438/424 |
| 5,933,748 | 8/1999 | Chou et al. | 438/437 |

Primary Examiner—Trung Dang
Attorney, Agent, or Firm—Thomas, Kayden, Horstemeyer & Risley

[57] ABSTRACT

A method of forming a shallow trench isolation in a semi-conductor substrate. A mask layer is formed to cover an active region of the substrate. A trench is formed within the exposed substrate. The trench is filled with an insulation layer. The dimension of the mask layer is shrunk. A thermal oxidation process is performed to form an oxide protrusion between the trench and the active region. The mask layer is removed.

11 Claims, 4 Drawing Sheets

METHOD OF FABRICATING SHALLOW TRENCH ISOLATION

CROSS-REFERENCE TO RELATED APPLICATION

This application claims the priority benefit of Taiwan application serial no. 87108605, filed Jun. 2, 1998, the full disclosure of which is incorporated herein by reference.

BACKGROUND OF THE INVENTION

1. Field of the Invention

The invention relates in general to a method of fabricating an integrated circuit, and more particularly, to a method of fabricating a shallow trench isolation (ST1).

2. Description of the Related Art

In an integrated circuit shallow trench isolations are commonly used for insulating adjacent devices such as metal-oxide semiconductors (MOS) or active regions. In a conventional method of fabricating a shallow trench isolation, typically, an anisotropic dry etching is used to form a trench in a semiconductor substrate. By filling the trench with an oxide layer, the shallow trench isolation is formed.

A conventional method of fabricating a shallow trench isolation is described with accordance of the accompanying drawings FIG. 1A to FIG. 1E. In FIG. 1A, a pad oxide layer 102 with a thickness of about 100 to 500 Å is formed on a semiconductor substrate 100. On the pad oxide layer 102, a mask layer 104 is formed, for example, a silicon nitride layer formed by chemical vapor deposition (CVD). The thickness of the mask layer 104 is about 1000 to 3000 Å. Using photolithography and etching, a photo-resist layer 106 with an opening exposing a part of the mask layer 104 is formed on the mask layer 104. The mask layer 104 exposed within the opening is then removed to expose the pad oxide layer 102. The photo-resist layer 106 is removed. Using the mask layer 104 as a mask, the exposed pad oxide layer 102 and a part of the underlying substrate 100 are removed by dry etch, so that a trench is formed 108. The regions of the semiconductor 100 covered the pad oxide layer 102 which is protected from being removed by the mask layer 104 is thus defined as an active region.

In FIG. 1C, a liner oxide layer is formed on the surface of the trench 108. The liner oxide layer joins the pad oxide layer 102 as the oxide layer denoted as 102a in the figure. An insulating layer, for example, a silicon oxide layer, is formed to cover the mask layer 104 and to fill the trench 108. The insulating layer is then polished until the mask layer 104 is exposed, so that an insulating plug 110 is formed within the trench 118.

In FIG. 1D, the mask layer 104 and the oxide layer 102a under the mask layer 104 are removed by isotropic wet etching with hydrogen fluoride (HF) as an etchant. After the removing process, the active region of the substrate 100 is exposed. The material of the insulating plug 110 and the oxide layer 102a are typically softer and easier to be removed than the material of the mask layer 104. Therefore, during the removing process a part of the side wall of the insulating plug 110 and the oxide layer 102a on the active region are removed while removing the mask layer 104. Furthermore, the topmost area of the liner oxide layer on the surface of the trench 108 is removed. As a consequence, the rim of the insulation plug 110 and the oxide layer 102a between the insulating plug 110 and the active region have a lower surface level than the active region of the substrate 100.

In FIG. 1E, to complete the formation of the shallow trench isolation, a polishing step is performed. The insulating plug 110 is polished by chemical-mechanical polishing until having a same surface level of the substrate 100. The polished insulating plug 110 is used as the shallow trench isolation and is denoted as 110a in the figure.

As mentioned above, the oxide between the shallow trench isolation 110a and the active region has a lower surface level than the active region of the substrate 100. When the shallow trench isolation 110a is formed, a notch, or a shoulder portion 112 is formed between the active region of the substrate 100 and the shallow trench isolation 110a. In the subsequent process of forming a gate oxide layer, a non-uniform gate oxide with poor quality is formed due to the formation of the shoulder portion 112. For a device formed on the gate oxide layer with a poor quality, the threshold voltage is seriously affected. During the metallization process, some metal interconnect extends over both the active region and the isolation structure. With the formation of the shoulder portion 112, an unwanted electrical couple is very likely to occur. Furthermore, in a subsequent ion implantation process, the shoulder portion will cause implanted ions accumulation. A kink effect is likely to occur to cause an abnormal sub-threshold current.

SUMMARY OF THE INVENTION

It is an object of the invention to provide a method of fabricating a shallow trench isolation. By this method, the shoulder portion occurs in the prior art technique is avoided. Therefore, in the subsequent process of forming a device, a gate oxide is formed uniformly. During metallization, the interconnect is formed over the positions between the active region and the isolation region without any unwanted electrical couple. Furthermore, the charge accumulation and the abnormal sub-threshold current due to kink effect arc suppressed.

To achieve the above-mentioned object and advantages, a method of fabricating a shallow trench isolation is provided. A pad oxide layer is formed on a semiconductor substrate. A mask layer is formed on the pad oxide layer. The mask layer is patterned to form an opening which exposes a part of the pad oxide layer. Using the mask layer as a mask, the exposed pad oxide layer and the substrate under the exposed pad oxide layer are etched to form a trench. A liner oxide layer is formed on a surface of the trench. An insulating layer is formed to cover the mask layer and to fill the trench. A polishing process is performed until the mask layer is exposed. A rim of the mask layer is removed, so that area of the pad oxide layer covered by the mask layer is reduced. That is, a part of the pad oxide on the active region of the substrate is exposed. With the mask layer as a mask, a thermal oxidation process is performed to thicken the exposed pad oxide layer. The mask layer is then removed.

Both the foregoing general description and the following detailed description are exemplary and explanatory only and are not restrictive of the invention, as claimed.

DESCRIPTION OF THE PREFERRED EMBODIMENTS

Referring to FIG. 2A to FIG. 2F, a method of forming a shallow trench isolation according to the invention is shown.

Figure 1A:
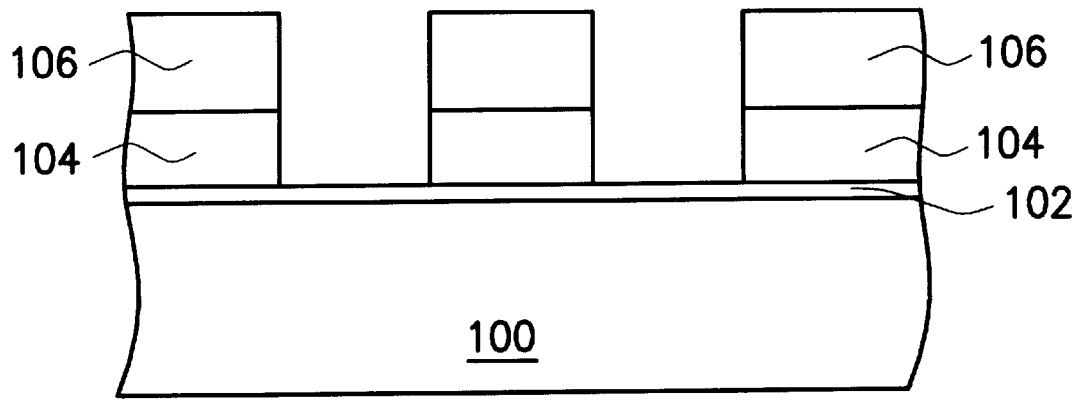
FIG. 1A to FIG. 1E are cross sectional views showing a conventional method of fabricating, a local interconnect.
Figure 1B:
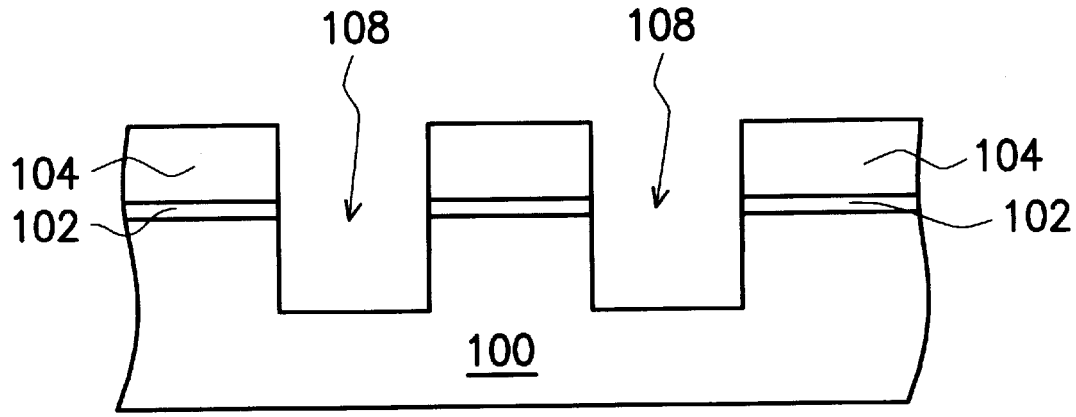
Figure 1C:
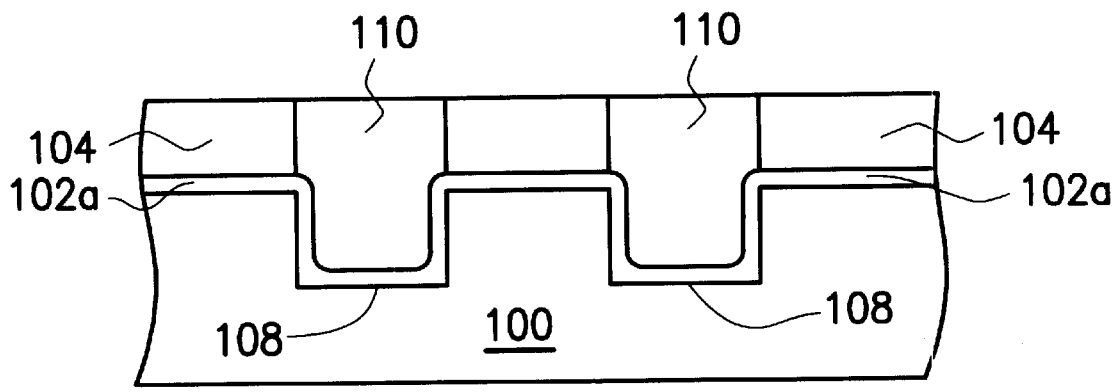
Figure 1D:
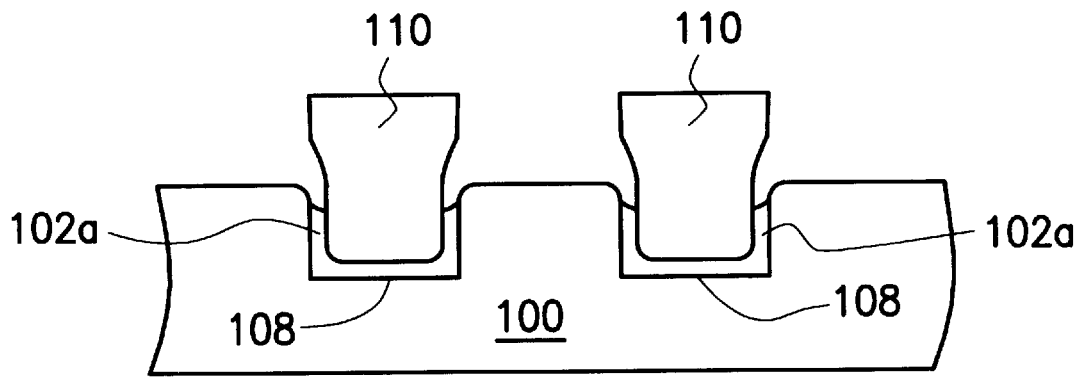
Figure 1E:
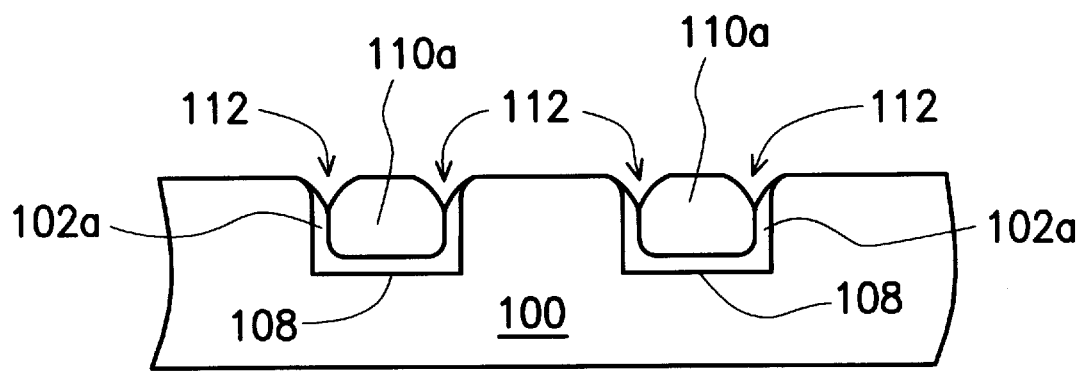
Figure 2A:
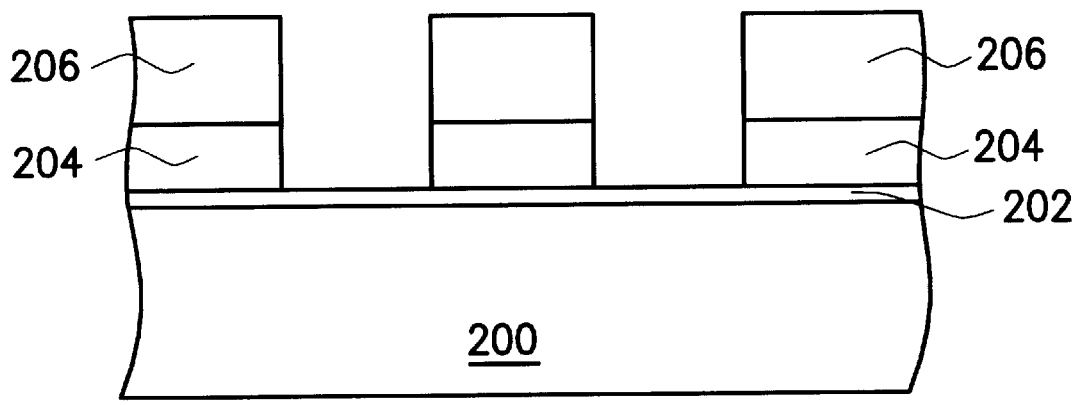
FIG. 2A and FIG. 2F are cross sectional views showing a method of fabricating a local interconnect in a first preferred embodiment according to the invention is shown.

In FIG. 2A, on a semiconductor substrate 200, a pad oxide layer 202 with a thickness of about 100 Å to 500 Å is formed. The pad oxide layer 202 is used to protect the surface of the substrate 200 and is removed before forming a gate oxide layer in the subsequent process. A mask layer 204 is formed on the pad oxide layer 202. The mask layer 204 is preferably a silicon nitride layer with a thickness of about 1000 Å to 3000 Å formed by chemical vapor deposition (CVD). Using photolithography, a photo-resist layer 206 is formed and patterned on the mask layer 204, so that a part of the mask layer 206 is exposed. As shown in the figure, the exposed mask layer 204 is then removed to expose a part if the pad oxide layer 202. The region of the substrate 200 under the exposed pad oxide layer 202 is determined as the active region.

Figure 2B:
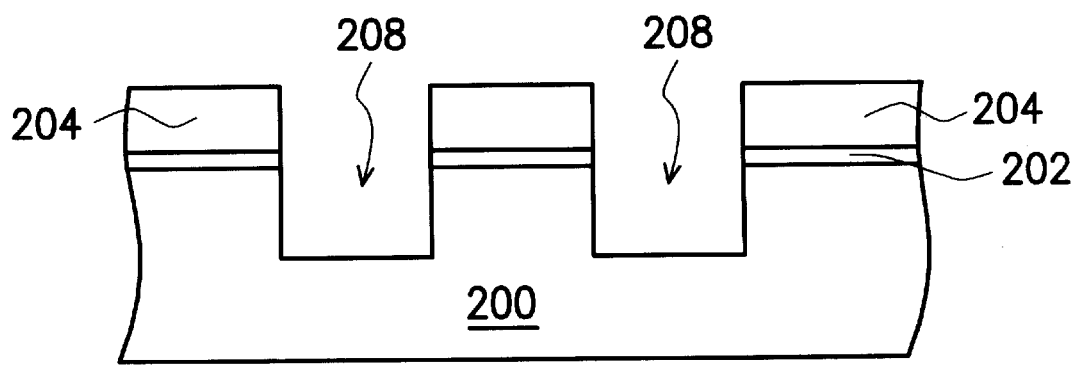

In FIG. 2B, using an etching process, for example, an anisotropic dry etching etching process, the exposed pad oxide layer 202 and a part of the substrate 200 under the exposed pad oxide layer 202 are removed to form a trench 208. Preferably, the trench has a thickness of about 3000 Å to 10000 Å. The photo-resist layer 206 is then removed.

Figure 2C:
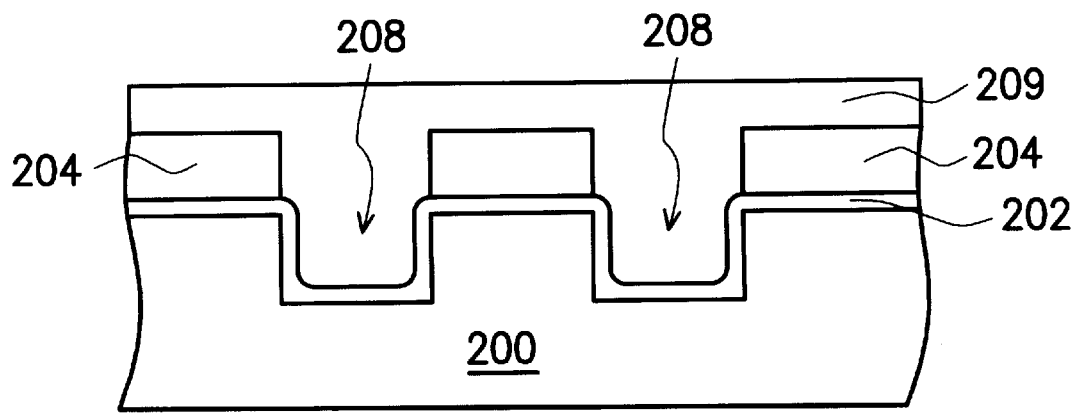

In FIG. 2C, using thermal oxidation, a liner oxide layer is formed on the surface of the trench 208. Preferably, the thickness of the liner oxide layer is about 100 Å to 500 Å. The liner oxide layer joins with the pad oxide layer 202, and the joint oxide layer is then denoted as 202a. An insulation layer 209, for example, a silicon oxide layer with a thickness ot about 5000 Å to 15 KÅ, is formed on the photo-resist layer and to fill the trench 208. The insulation layer 209 can be formed by chemical vapor deposition for example, atmosphere pressure chemical vapor deposition (APCVD). Preferably, the silicon oxide layer is formed under an environment of tetra-ethyl-ortho-silicate (TEOS). The trench 208 is typically over filled. A densification is further performed to the insulation layer 209, the insulation layer 209 is thus shrunk after being densified. The insulation layer 209 is typically densified at about 1000 Å for 10 to 30 mins.

Figure 2D:
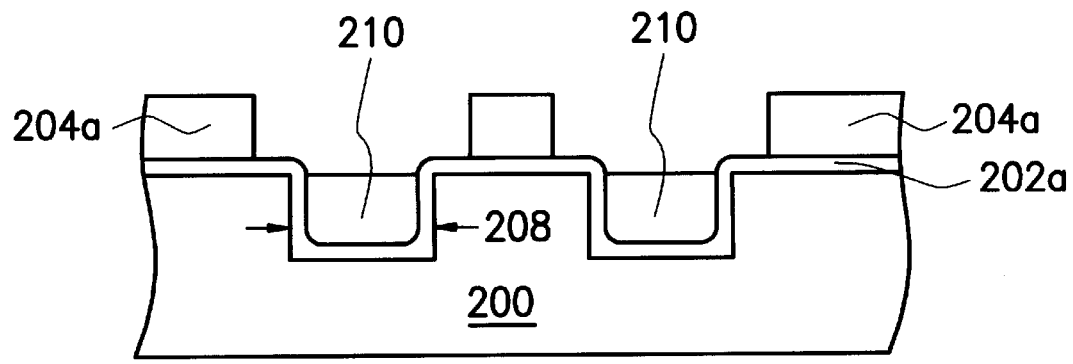

In FIG. 2D, the insulation layer 209 is polished with the mask layer 204 as a polishing stop. That is, the polishing step is stopped until the mask layer 204 is exposed. Since the material of the insulation layer 209 is typically softer than the material of the mask layer 204, after the polishing process, the surface level of the mask layer 204 is higher than the surface level of the insulation layer 209. The polishing step includes a chemical mechanical polishing (CMP) or an etch back process. The insulation layer 209 is then etched until having substantially the same surface level as the substrate 200. A insulation plug 210 is thus formed. A surface region of the mask layer 204 is removed to expose a part of the oxide layer 202a on the active region of the substrate 200. The surface region of the mask layer 204 are removed, preferably, by isotropic wet etching process, for example, by dipping the hard mask layer 204 with hydrogen fluoride solution or using plasma etching to remove the mask layer 204 inwards from the surface area. As the mask layer 204 is shrunk after the removing process, the area of oxide layer 202a covered by the shrunk mask layer 204a becomes smaller. More specifically, in this embodiment, the oxide layer 202 around the trench 208 is exposed after the removing process. While removing the surface region of the mask layer 204, a part of the oxide layer 202 and the surface of the insulation plug 210 are also removed. Therefore, a high selectivity of the mask layer 204 to the insulation plug 210 is required.

Figure 2E:
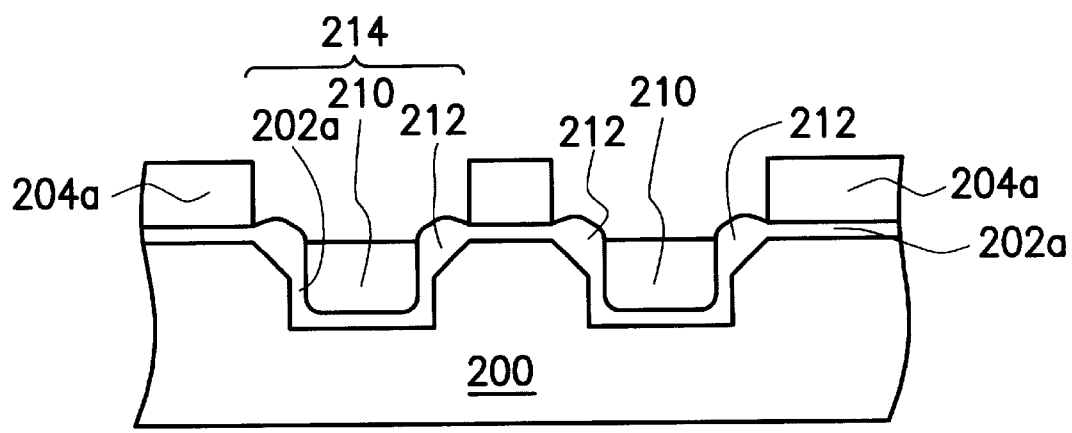

In the prior technique, the surface level of the rim of the trench is lower than the substrate. That is, a shoulder portion is formed while forming a trench. In FIG. 2E, a thermal process is performed to further oxidize the substrate under the exposed pad oxide layer 202a. As a consequence, the substrate under the exposed pad oxide layer 202a, that is, the deposition layer between the trench 208 and the active region is thickened to have approximately a surface level the same or even higher than the substrate 200 by the thermal oxidation. As shown in the figure, an oxide protrusion 212 between the active region and the trench 208 is formed. The parameters of the thermal oxidation depends on the required thickness of the oxide protrusion 212, is preferably, at about 800° C. to 1100° C. for about 10 to 30 min. The shallow trench isolation 214 thus comprises the pad oxide layer 202a within the trench 208, the oxide protrusion 212, and the insulation plug 210.

Figure 2F:
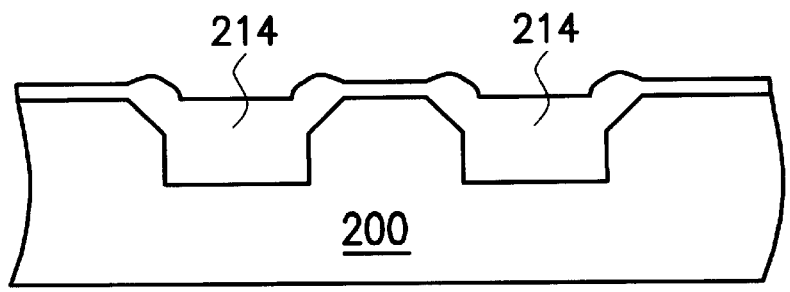

In FIG. 2F, the mask layer 204a is then removed, preferably, by wet etching.

In the invention, the formation of the oxide protrusion 212 improves the formation of a shoulder portion. Therefore, the kink effect and the abnormal sub-threshold voltage is suppressed. A device with a better performance and a higher reliability is thus obtained.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a shallow trench isolation in a semiconductor substrate, comprising:

forming a pad oxide layer on the substrate;

performing a deposition step to form a mask layer;

patterning the mask layer to form a patterned mask layer, wherein the patterned mask layer remains from the mask layer and exposes a part of the pad oxide layer;

removing a exposed pad oxide and a part of the substrate under the exposed pad oxide layer to form a trench;

forming a liner oxide layer on a surface of the trench;

forming an insulation layer over the patterned mask layer and to fill the trench;

planarizing the insulation layer until exposing the patterned mask layer;

removing the insulation layer until having a surface level substantially the same as the substrate;

removing a part of the patterned mask layer to expose the pad oxide layer around the trench; and performing a thermal oxidation to thicken the exposed pad oxide layer; and removing the patterned mask layer.

2. The method according to claim 1, further comprising the step of forming the pad oxide layer with a thickness of about 100 Å to 500 Å.

3. The method according to claim 1, wherein the mask layer includes a silicon nitride layer.

4. The method according to claim 1, further comprising the step of forming the trench having a depth of about 3000 Å to 10000 Å.

5. The method according to claim 1, further comprising the step of forming the liner oxide layer with a thickness of about 100 Å to 500 Å.

6. The method according to claim 1 wherein the insulation layer includes a silicon oxide layer.

7. The method according to claim 6, further comprising the step of forming the silicon oxide layer by chemical vapor deposition under an environment of tetra-ethyl-ortho-silicate.

8. The method according to claim 1, further comprising the step of densifying the insulation layer.

9. The method according to claim 1, further comprising the step of performing the thermal oxidation under an oxygen environment at about 800° C. to 1100° C. for about 10 to 30 min.

10. The method according to claim 1, further comprising the step of removing a part of the mask layer by isotropic wet etching.

11. The method according to claim 1, further comprising the step of removing a part of the mask layer by plasma etching.

* * * * *